(12) United States Patent
Ueda et al.

(10) Patent No.: US 9,208,741 B2
(45) Date of Patent: Dec. 8, 2015

(54) DISPLAY PANEL

(75) Inventors: Nobuyoshi Ueda, Osaka (JP); Isao Ogasawara, Osaka (JP); Satoshi Horiuchi, Osaka (JP); Shinya Tanaka, Osaka (JP); Tetsuo Kikuchi, Osaka (JP); Masahiro Yoshida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 605 days.

(21) Appl. No.: 13/636,281

(22) PCT Filed: Jan. 28, 2011

(86) PCT No.: PCT/JP2011/051753
§ 371 (c)(1),
(2), (4) Date: Sep. 20, 2012

(87) PCT Pub. No.: WO2011/129134
PCT Pub. Date: Oct. 20, 2011

(65) Prior Publication Data
US 2013/0009925 A1     Jan. 10, 2013

(30) Foreign Application Priority Data
Apr. 16, 2010   (JP) .................................. 2010-095528

(51) Int. Cl.
*G06F 3/048*     (2013.01)
*G09G 3/36*      (2006.01)
(Continued)

(52) U.S. Cl.
CPC .......... *G09G 3/3677* (2013.01); *G02F 1/13454* (2013.01); *H01L 29/42384* (2013.01);
(Continued)

(58) Field of Classification Search
CPC ................. G09G 2310/0281; G09G 2330/08; G09G 2320/0247; G09G 2300/0408; G09G 2310/0286; H01L 27/1255; H01L 29/42384; G02F 1/13452; G02F 1/13454
See application file for complete search history.

(56) References Cited

U.S. PATENT DOCUMENTS 6,930,665 B2* 8/2005 Sekine .......................... 345/100
7,215,333 B2* 5/2007 Chen et al. .................... 345/208
(Continued)

FOREIGN PATENT DOCUMENTS

JP          03-255424 A     11/1991
JP          11-160730 A      6/1999
(Continued)

OTHER PUBLICATIONS

Official Communication issued in International Patent Application No. PCT/JP2011/051753, mailed on May 17, 2011.

*Primary Examiner* — Abbas Abdulselam
(74) *Attorney, Agent, or Firm* — Keating & Bennett, LLP (57) ABSTRACT

On a display panel 10, a first scanning signal line drive circuit 12 is formed along a side of a display region 11 and a second scanning signal line drive circuit 13 is formed along the opposite side by the same process as pixel circuits. The size of a transistor included, the width of a wiring line, or the like, differs between the first and second scanning signal line drive circuits 12 and 13, and the two scanning signal line drive circuits have different sizes in a lateral direction. By this, the center of the display region matches that of a non-integral-type display panel, ensuring compatibility with the non-integral-type display panel. Moreover, by suitably determining the widths of or spacings between wiring lines included in the two scanning signal line drive circuits, leakage between the wiring lines and breaks in the wiring lines are reduced, improving yield of display panels.

13 Claims, 7 Drawing Sheets

(51) Int. Cl.
  *H01L 29/423* (2006.01)
  *G02F 1/1345* (2006.01)
  *G02F 1/1333* (2006.01)
  *H01L 27/12* (2006.01)

(52) U.S. Cl.
  CPC . *G02F1/13452* (2013.01); *G02F 2001/133388* (2013.01); *G09G 2300/0408* (2013.01); *G09G 2310/0281* (2013.01); *G09G 2310/0286* (2013.01); *G09G 2320/0247* (2013.01); *G09G 2330/08* (2013.01); *H01L 27/1255* (2013.01)

(56) References Cited

U.S. PATENT DOCUMENTS

| | | | |
|---|---|---|---|
| 7,719,510 B2* | 5/2010 | Guo et al. | 345/100 |
| 8,692,741 B2* | 4/2014 | Shin | 345/76 |
| 2002/0075249 A1 | 6/2002 | Kubota et al. | |
| 2003/0227433 A1 | 12/2003 | Moon | |
| 2004/0041777 A1 | 3/2004 | Toyozawa et al. | |
| 2006/0001637 A1 | 1/2006 | Pak et al. | |
| 2007/0001148 A1 | 1/2007 | Adachi et al. | |
| 2009/0052001 A1 | 2/2009 | Mochizuki | |
| 2010/0066922 A1 | 3/2010 | Kumada | |

FOREIGN PATENT DOCUMENTS

| | | |
|---|---|---|
| JP | 2002-032048 A | 1/2002 |
| JP | 2002-358051 A | 12/2002 |
| JP | 2004-157508 A | 6/2004 |
| JP | 2006-024350 A | 1/2006 |
| JP | 2007-011095 A | 1/2007 |
| JP | 2008-299941 A | 12/2008 |
| JP | 2009-048144 A | 3/2009 |
| WO | 03/036606 A1 | 5/2003 |

* cited by examiner

DISPLAY PANEL

TECHNICAL FIELD

The present invention relates to a display panel such as a liquid crystal panel, and more particularly to a display panel in which scanning signal line drive circuits are integrally formed.

BACKGROUND ART

For a method of making a display device small, there is known a method in which a scanning signal line drive circuit (gate driver circuit) that drives scanning signal lines (gate lines) arranged in a display region is integrally formed on a display panel. A display panel adopting this method is also called a display panel of a gate driver monolithic type.

Figure 11:
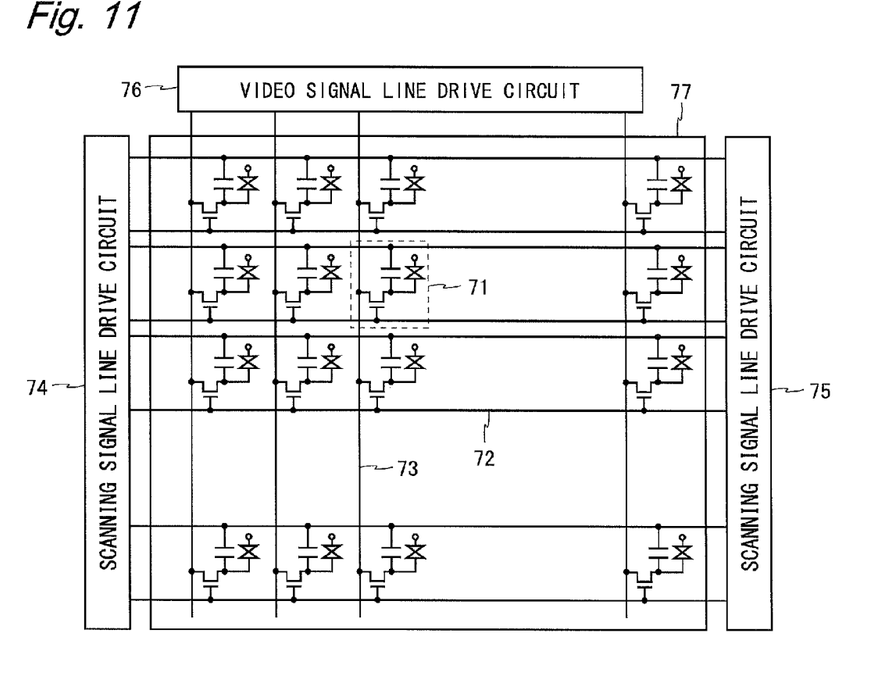
FIG. 11 is a diagram showing a configuration of a conventional liquid crystal display device.

Apart from this, there is conventionally known a method in which scanning signal line drive circuits are provided on both sides of a display region. For example, Patent Document 1 describes a liquid crystal display device shown in FIG. 11. The liquid crystal display device shown in FIG. 11 includes a plurality of pixel circuits 71, a plurality of scanning signal lines 72, a plurality of video signal lines 73, scanning signal line drive circuits 74 and 75, and a video signal line drive circuit 76. The pixel circuits 71, the scanning signal lines 72, and the video signal lines 73 are arranged inside a display region 77. The scanning signal line drive circuit 74 is arranged along one side of the display region 77 and is connected to one ends (left ends in FIG. 11) of the respective scanning signal lines 72. The scanning signal line drive circuit 75 is arranged along the opposite side of the display region 77 and is connected to the other ends (right ends in FIG. 11) of the respective scanning signal lines 72. The scanning signal lines 72 are driven from their both ends by the two scanning signal line drive circuits 74 and 75.

PRIOR ART DOCUMENT

Patent Document

[Patent Document 1] Japanese Laid-Open Patent Publication No. 2002-358051

SUMMARY OF THE INVENTION

Problems to be Solved by the Invention

By combining the above-described conventional techniques, a display panel in which scanning signal line drive circuits are integrally formed on both sides of a display region can be obtained. However, the display panel adopting a combination of the conventional techniques (hereinafter, referred to as a conventional integral-type display panel) has a problem that the display panel is not compatible with a display panel having mounted thereon semiconductor chips including a scanning signal line drive circuit (hereinafter, referred to as a non-integral-type display panel).

Figure 12:
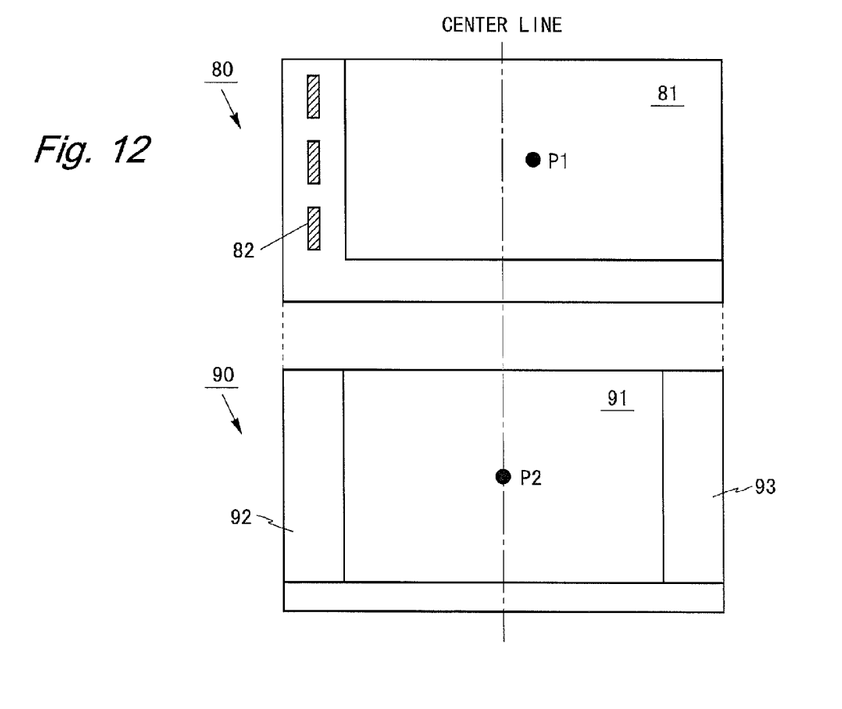
FIG. 12 is a diagram for describing a problem of a conventional integral-type display panel.

With reference to FIG. 12, this problem will be described in detail. In FIG. 12, it is assumed that scanning signal lines extend in a horizontal direction. In a non-integral-type display panel 80, semiconductor chips 82 including a scanning signal line drive circuit are mounted on one edge (left edge in FIG. 12) of the panel. Hence, in the non-integral-type display panel 80, a center P1 of a display region 81 is at a location off a center line of the panel.

On the other hand, in a conventional integral-type display panel 90, scanning signal line drive circuits 92 and 93 having the same configuration are provided symmetrically on both sides of a display region 91. Hence, in the conventional integral-type display panel 90, a center P2 of the display region 91 is on the center line of the panel. As such, the center position of the display region differs between the non-integral-type display panel 80 and the conventional integral-type display panel 90. Therefore, for example, a display device whose casing, or the like, are designed in accordance with the non-integral-type display panel 80 encounters a problem that the display device cannot use the conventional integral-type display panel 90 as it is, in place of the non-integral-type display panel 80.

In addition, a display panel in which a scanning signal line drive circuit is integrally formed also has a problem that leakage between wiring lines and breaks in wiring lines are likely to occur, reducing yield.

An object of the present invention is therefore to provide a display panel in which scanning signal line drive circuits are integrally formed and which is compatible with a non-integral-type display panel.

Means for Solving the Problems

According to a first aspect of the present invention, there is provided a display panel in which scanning signal line drive circuits are integrally formed, the display panel including: a display region including a plurality of pixel circuits arranged two-dimensionally and a plurality of scanning signal lines extending in a predetermined direction; a first scanning signal line drive circuit formed along one side of the display region by a same process as the pixel circuits, and driving the scanning signal lines; and a second scanning signal line drive circuit formed along an opposite side of the display region by the same process as the pixel circuits, and driving the scanning signal lines with the first scanning signal line drive circuit, wherein the first and second scanning signal line drive circuits have different sizes in a lateral direction (that is, sizes of arrangement regions of circuits in a extending direction of the scanning signal lines).

According to a second aspect of the present invention, in the first aspect of the present invention, the first and second scanning signal line drive circuits each include a shift register having unit circuits connected in multi-stage and a plurality of main wiring lines that supply a power supply potential and a control signal to the shift register, each unit circuit including a signal control unit that determines a potential to be applied to a corresponding scanning signal line and an output unit that applies the potential determined by the signal control unit to the scanning signal line.

According to a third aspect of the present invention, in the second aspect of the present invention, the output unit includes a pull-up transistor that applies a high-level potential to the scanning signal line and a pull-down transistor that applies a low-level potential to the scanning signal line, and a size of at least one of the pull-up transistor and the pull-down transistor differs between the first and second scanning signal line drive circuits.

According to a fourth aspect of the present invention, in the second aspect of the present invention, the output unit includes a bootstrap capacitor provided at a control terminal of a transistor that applies a potential to the scanning signal line, and a capacitance of the bootstrap capacitor differs between the first and second scanning signal line drive circuits.

According to a fifth aspect of the present invention, in the second aspect of the present invention, a size of a transistor included in the signal control unit differs between the first and second scanning signal line drive circuits.

According to a sixth aspect of the present invention, in the second aspect of the present invention, widths of the main wiring lines differ between the first and second scanning signal line drive circuits.

According to a seventh aspect of the present invention, in the sixth aspect of the present invention, a width of a main wiring line for power supply included in the main wiring lines differs between the first and second scanning signal line drive circuits.

According to an eighth aspect of the present invention, in the sixth aspect of the present invention, a width of a main wiring line for a clock included in the main wiring lines differs between the first and second scanning signal line drive circuits.

According to a ninth aspect of the present invention, in the second aspect of the present invention, a width of a wiring line included in the signal control unit differs between the first and second scanning signal line drive circuits.

According to a tenth aspect of the present invention, in the second aspect of the present invention, a spacing between wiring lines included in the signal control unit differs between the first and second scanning signal line drive circuits.

According to an eleventh aspect of the present invention, in the first aspect of the present invention, each pixel circuit includes a component whose size varies according to a position thereof in an extending direction of the scanning signal lines, and the size of the component is maximum or minimum at a pixel circuit close to one of the first and second scanning signal line drive circuits whose size in the lateral direction is smaller than that of the other.

According to a twelfth aspect of the present invention, in the eleventh aspect of the present invention, each pixel circuit includes a write control transistor and a correction capacitor provided between a control terminal and one conduction terminal of the write control transistor, and a size of the correction capacitor varies according to a position thereof in the extending direction of the scanning signal lines, and is maximum at a pixel circuit close to one of the first and second scanning signal line drive circuits whose size in the lateral direction is smaller than that of the other.

According to a thirteenth aspect of the present invention, in the first aspect of the present invention, the display panel further includes a connecting wiring line that connects a main wiring line included in the first scanning signal line drive circuit to a main wiring line included in the second scanning signal line drive circuit.

According to a fourteenth aspect of the present invention, in the thirteenth aspect of the present invention, the display panel includes a chip-mounted region for a video signal line drive circuit provided along one of four sides of the display region other than sides where the first and second scanning signal line drive circuits are formed, wherein the connecting wiring line is arranged along a remaining side of the display region.

Effects of the Invention

According to the first aspect of the present invention, by providing scanning signal line drive circuits on both sides of the display region such that their arrangement regions are asymmetrical, the center of the display region of the display panel matches that of a non-integral-type display panel (a display panel having mounted thereon semiconductor chips including a scanning signal line drive circuit), enabling to ensure compatibility with the non-integral-type display panel. In addition, when designing a product in which the center of a display region does not match the center of a display panel, in particular, when arranging scanning signal line drive circuits in a narrow region (in the case of a so-called a narrow picture-frame), it is desirable to provide the scanning signal line drive circuits on both sides of the display region such that their arrangement regions are asymmetrical. In such a case, by suitably determining the widths of or spacings between wiring lines included in the scanning signal line drive circuits, leakage between the wiring lines and breaks in the wiring lines are reduced, enabling to improve yield of display panels.

According to the second aspect of the present invention, by asymmetrically providing scanning signal line drive circuits, each including a shift register and main wiring lines, on both sides of the display region, the center of the display region of the display panel matches that of a non-integral-type display panel, enabling to ensure compatibility with the non-integral-type display panel. In addition, by suitably determining the widths of or spacings between wiring lines included in the scanning signal line drive circuits, yield of display panels can be improved.

According to the third aspect of the present invention, by providing scanning signal line drive circuits having pull-up transistors or pull-down transistors being different in size therebetween on both sides of the display region, the center of the display region of the display panel matches that of a non-integral-type display panel, enabling to ensure compatibility with the non-integral-type display panel.

According to the fourth aspect of the present invention, by providing scanning signal line drive circuits having bootstrap capacitors being different in capacitance therebetween on both sides of the display region, the center of the display region of the display panel matches that of a non-integral-type display panel, enabling to ensure compatibility with the non-integral-type display panel.

According to the fifth aspect of the present invention, by providing scanning signal line drive circuits whose transistors included in signal control units are different in size therebetween on both sides of the display region, the center of the display region of the display panel matches that of a non-integral-type display panel, enabling to ensure compatibility with the non-integral-type display panel.

According to the sixth to eighth aspects of the present invention, by providing scanning signal line drive circuits having main wiring lines, main wiring lines for power supply, or main wiring lines for a clock being different in width therebetween on both sides of the display region, the center of the display region of the display panel matches that of a non-integral-type display panel, enabling to ensure compatibility with the non-integral-type display panel.

According to the ninth or tenth aspect of the present invention, when scanning signal line drive circuits are designed to have different sizes in a lateral direction, by suitably determining the widths of or spacings between wiring lines included in signal control units, leakage between the wiring lines and breaks in the wiring lines are reduced, enabling to improve yield of display panels.

According to the eleventh aspect of the present invention, by changing the size of a component included in each pixel circuit according to the position thereof in the extending direction of the scanning signal lines such that the size of the component is maximum or minimum at a pixel circuit close to one of the scanning signal line drive circuits whose size in the lateral direction is smaller than that of the other, even when the scanning signal line drive circuits are provided asymmetrically on both sides of the display region, a suitable correction is made according to the position in the extending direction of the scanning signal lines and thus desired voltages can be written to the pixel circuits, enabling to prevent a reduction in display quality.

According to the twelfth aspect of the present invention, by changing the size of a correction capacitor included in each pixel circuit according to the position thereof in the extending direction of the scanning signal lines such that the size of the correction capacitor is maximum at a pixel circuit close to one of the scanning signal line drive circuits whose size in the lateral direction is smaller than that of the other, even when the scanning signal line drive circuits are provided asymmetrically on both sides of the display region, a suitable correction is made according to the position in the extending direction of the scanning signal lines and thus desired voltages can be written to the pixel circuits, enabling to prevent a reduction in display quality.

According to the thirteenth aspect of the present invention, by connecting main wiring lines included in the scanning signal line drive circuits provided on both sides of the display region, using a connecting wiring line, the number of wiring lines connecting the scanning signal line drive circuits to the outside of the display panel is reduced, thereby narrowing the width of a board connected to the display panel, and thus, the cost of the board can be reduced.

According to the fourteenth aspect of the present invention, by arranging the connecting wiring line along the remaining side of the display region, the connecting wiring line is arranged so as not to intersect with video signal lines arranged in the display region, thereby reducing the load associated with the video signal lines, and thus, a reduction in display quality can be prevented.

MODES FOR CARRYING OUT THE INVENTION

First Embodiment

Figure 1:
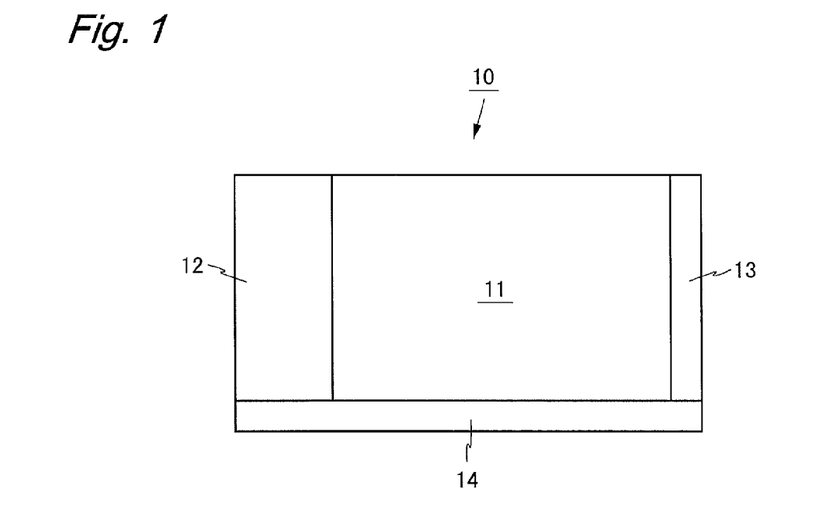
FIG. 1 is a plan view showing a schematic configuration of a display panel according to a first embodiment of the present invention.

FIG. 1 is a plan view showing a schematic configuration of a display panel according to a first embodiment of the present invention. A display panel 10 shown in FIG. 1 is a liquid crystal panel including a display region 11, a first scanning signal line drive circuit 12, a second scanning signal line drive circuit 13, and a chip-mounted region 14 for a video signal line drive circuit. In the following, m and n are integers not less than 2.

Figure 2:
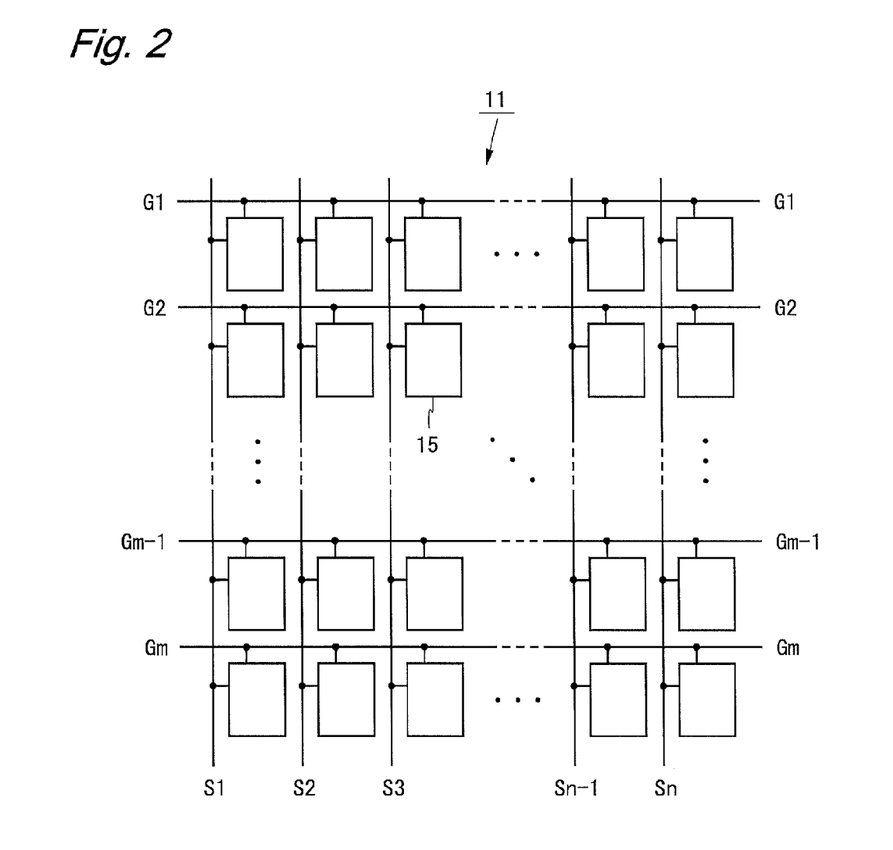
FIG. 2 is a circuit diagram of circuits formed in a display region of the display panel shown in FIG. 1.

FIG. 2 is a circuit diagram of circuits formed in the display region 11. As shown in FIG. 2, m scanning signal lines G1 to Gm, n video signal lines S1 to Sn, and (m×n) pixel circuits 15 are formed in the display region 11. The scanning signal lines G1 to Gm are arranged parallel to one another and extend in a predetermined direction (a horizontal direction in FIG. 2). The video signal lines S1 to Sn are arranged parallel to one another so as to orthogonally intersect with the scanning signal lines G1 to Gm. The (m×n) pixel circuits 15 are arranged near the intersections of the scanning signal lines G1 to Gm and the video signal lines S1 to Sn. As such, the display region 11 includes the plurality of pixel circuits 15 arranged two-dimensionally and the plurality of scanning signal lines G1 to Gm extending in the predetermined direction.

The first scanning signal line drive circuit 12 and the second scanning signal line drive circuit 13 are integrally formed on the display panel 10 by the same process as the pixel circuits 15. In FIG. 1, the horizontal direction is the extending direction of the scanning signal lines G1 to Gm. The first scanning signal line drive circuit 12 is formed along one side (the left side in FIG. 1) of the display region 11 and is connected to one ends (left ends in FIG. 1) of the respective scanning signal lines G1 to Gm. The second scanning signal line drive circuit 13 is formed along the opposite side (the right side in FIG. 1) of the display region 11 and is connected to the other ends (right ends in FIG. 1) of the respective scanning signal lines G1 to Gm. The scanning signal lines G1 to Gm are driven from their both ends by the first scanning signal line drive circuit 12 and the second scanning signal line drive circuit 13.

The chip-mounted region 14 is provided along one (the lower side in FIG. 1) of the four sides of the display region 11 other than the sides where the first scanning signal line drive circuit 12 and the second scanning signal line drive circuit 13 are formed. In the chip-mounted region 14 is mounted a semiconductor chip (not shown) including a video signal line drive circuit. The video signal lines S1 to Sn are driven by the video signal line drive circuit included in the semiconductor chip.

Figure 3:
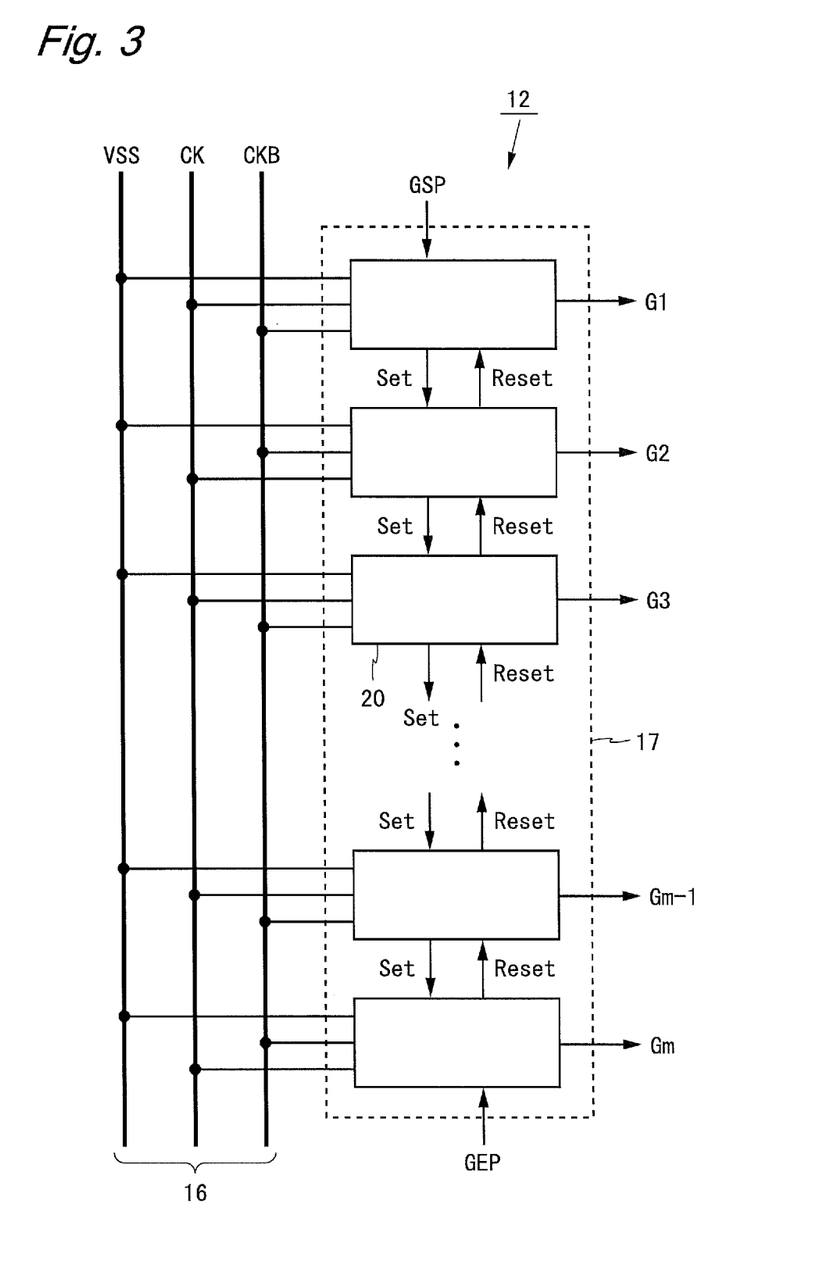
FIG. 3 is a block diagram showing a configuration of a scanning signal line drive circuit included in the display panel shown in FIG. 1.

FIG. 3 is a block diagram showing a configuration of the first scanning signal line drive circuit 12. As shown in FIG. 3, the first scanning signal line drive circuit 12 includes a plurality of main wiring lines 16 and a shift register 17 having m unit circuits 20 connected in multi-stage. The main wiring lines 16 shown in FIG. 3 include a low-level power supply wiring line VSS and clock wiring lines CK and CKB. The low-level power supply wiring line VSS supplies a low-level power supply potential to the shift register 17, and the clock wiring lines CK and CKB supply clock signals to the shift register 17. Note that the main wiring lines 16 may include a high-level power supply wiring line VDD, three or more clock wiring lines, a signal wiring line for resetting the potential of a floating electrode to a predetermined level, or the like.

Figure 4:
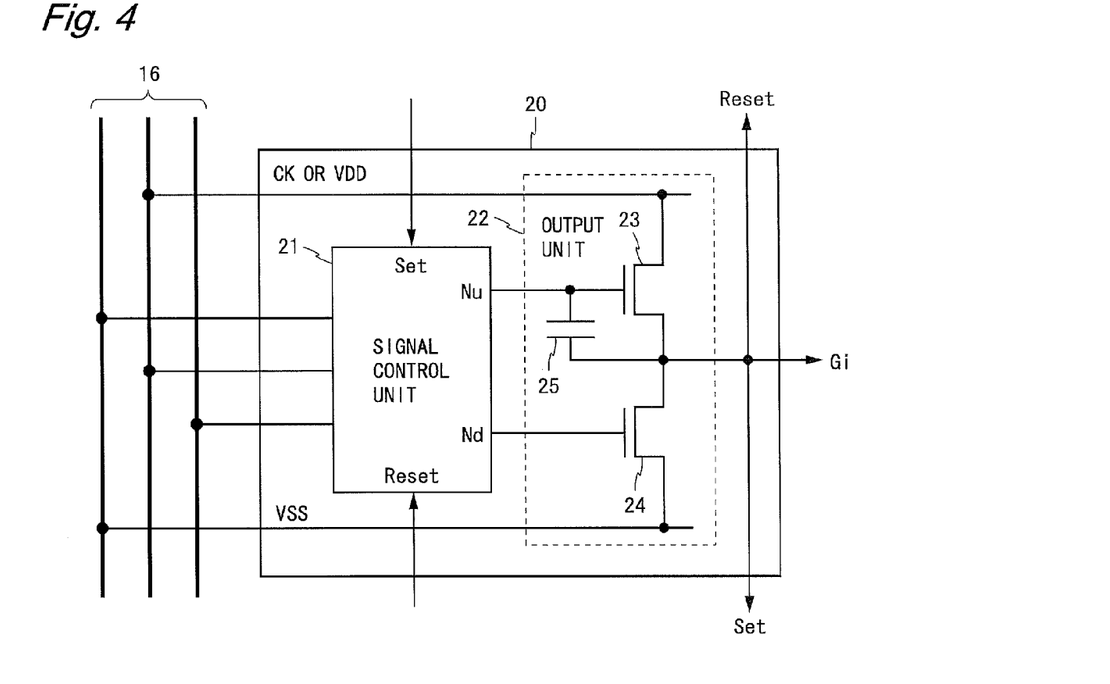
FIG. 4 is a diagram showing a configuration of one stage of a shift register included in the scanning signal line drive circuit shown in FIG. 3.

FIG. 4 is a diagram showing a configuration of one stage of the shift register 17. As shown in FIG. 4, the unit circuit 20 includes a signal control unit 21 and an output unit 22. To the signal control unit 21 are inputted a set signal outputted from a unit circuit 20 in a previous stage and a reset signal outputted from a unit circuit 20 in a next stage. In addition, to the signal control unit 21 are supplied a power supply potential and control signals (e.g., clock signals) from the main wiring lines 16. Based on these input signals, the signal control unit 21 determines a potential to be applied to a scanning signal line Gi. The signal control unit 21 has a first output terminal Nu and a second output terminal Nd. When a high-level potential is to be applied to the scanning signal line Gi, a high-level potential is applied to the first output terminal Nu, and when a low-level potential is to be applied to the scanning signal line Gi, a high-level potential is applied to the second output terminal Nd.

The output unit 22 includes a pull-up transistor 23, a pull-down transistor 24, and a bootstrap capacitor 25. A drain terminal of the pull-up transistor 23 is connected to the clock wiring line CK or the high-level power supply wiring line VDD, a source terminal is connected to the scanning signal line Gi, and a gate terminal is connected to the first output terminal Nu of the signal control unit 21. A source terminal of the pull-down transistor 24 is connected to the low-level power supply wiring line VSS, a drain terminal is connected to the scanning signal line Gi, and a gate terminal is connected to the second output terminal Nd of the signal control unit 21. The bootstrap capacitor 25 is provided at the gate terminal of the pull-up transistor 23.

When a high-level potential is applied to the first output terminal Nu, the pull-up transistor 23 is placed in an on state and thus a high-level potential is applied to the scanning signal line Gi from the clock wiring line CK or the high-level power supply wiring line VDD. When a high-level potential is applied to the second output terminal Nd, the pull-down transistor 24 is placed in an on state and thus a low-level potential is applied to the scanning signal line Gi from the low-level power supply wiring line VSS. As such, the pull-up transistor 23 applies a high-level potential to the scanning signal line Gi and the pull-down transistor 24 applies a low-level potential to the scanning signal line Gi. A signal on the scanning signal line Gi is supplied to the unit circuit 20 in the previous stage as a reset signal, and is supplied to the unit circuit 20 in the next stage as a set signal.

The gate terminal of the pull-up transistor 23 is provided with the bootstrap capacitor 25. Hence, when the source potential of the pull-up transistor 23 is changed, the gate potential of the pull-up transistor 23 is pulled up greatly through the bootstrap capacitor 25, and thus, the output impedance of the pull-up transistor 23 decreases. As such, the bootstrap capacitor 25 assists in supplying a high-level potential. Note that instead of a configuration in which the bootstrap capacitor is connected to the source terminal of the pull-up transistor 23, it is also possible to adopt a configuration in which the bootstrap capacitor is connected to a wiring line connected to a clock wiring line, a configuration in which the bootstrap capacitor is connected to a terminal included in the signal control unit 21, or the like.

The second scanning signal line drive circuit 13 has the same configuration as the first scanning signal line drive circuit 12 (see FIG. 3). Note, however, that the size of a transistor included, the width of a wiring line, or the like, differs between the first scanning signal line drive circuit 12 and the second scanning signal line drive circuit 13, and thus, the first scanning signal line drive circuit 12 and the second scanning signal line drive circuit 13 have different sizes in a lateral direction (the horizontal direction in FIG. 1).

More specifically, the display panel 10 is configured such that the size in the lateral direction of the first scanning signal line drive circuit 12 is larger than the size in the lateral direction of the second scanning signal line drive circuit 13. For this purpose, the size of the pull-up transistors 23 included in the first scanning signal line drive circuit 12 may be made larger than the size of the pull-up transistors 23 included in the second scanning signal line drive circuit 13. Alternatively, the size of the pull-down transistors 24 included in the first scanning signal line drive circuit 12 may be made larger than the size of the pull-down transistors 24 included in the second scanning signal line drive circuit 13. Alternatively, the size of the bootstrap capacitors 25 included in the first scanning signal line drive circuit 12 may be made larger than the size of the bootstrap capacitors 25 included in the second scanning signal line drive circuit 13. Alternatively, the size of transistors included in the signal control units 21 of the first scanning signal line drive circuit 12 may be made larger than the size of transistors included in the signal control units 21 of the second scanning signal line drive circuit 13.

Alternatively, the widths of the main wiring lines 16 included in the first scanning signal line drive circuit 12 may be made wider than the widths of the main wiring lines 16 included in the second scanning signal line drive circuit 13. In this case, the width of a main wiring line for power supply included in the first scanning signal line drive circuit 12 may be made wider than the width of a main wiring line for power supply included in the second scanning signal line drive circuit 13, or the width of a main wiring line for a clock included in the first scanning signal line drive circuit 12 may be made wider than the width of a main wiring line for a clock included in the second scanning signal line drive circuit 13. These methods may be applied alone or may be applied by arbitrarily combining them. By this, two scanning signal line drive circuits having different sizes in the lateral direction are obtained and thus the two scanning signal line drive circuits are provided asymmetrically on both sides of the display region 11 on the display panel 10.

When two scanning signal line drive circuits are designed to have different sizes in the lateral direction, the widths of wiring lines included in the signal control units 21 of the first scanning signal line drive circuit 12 may be made wider than the widths of wiring lines included in the signal control units 21 of the second scanning signal line drive circuit 13. Alternatively, the spacings between wiring lines included in the signal control units 21 of the first scanning signal line drive circuit 12 may be made larger than the spacings between wiring lines included in the signal control units 21 of the second scanning signal line drive circuit 13.

Figure 5:
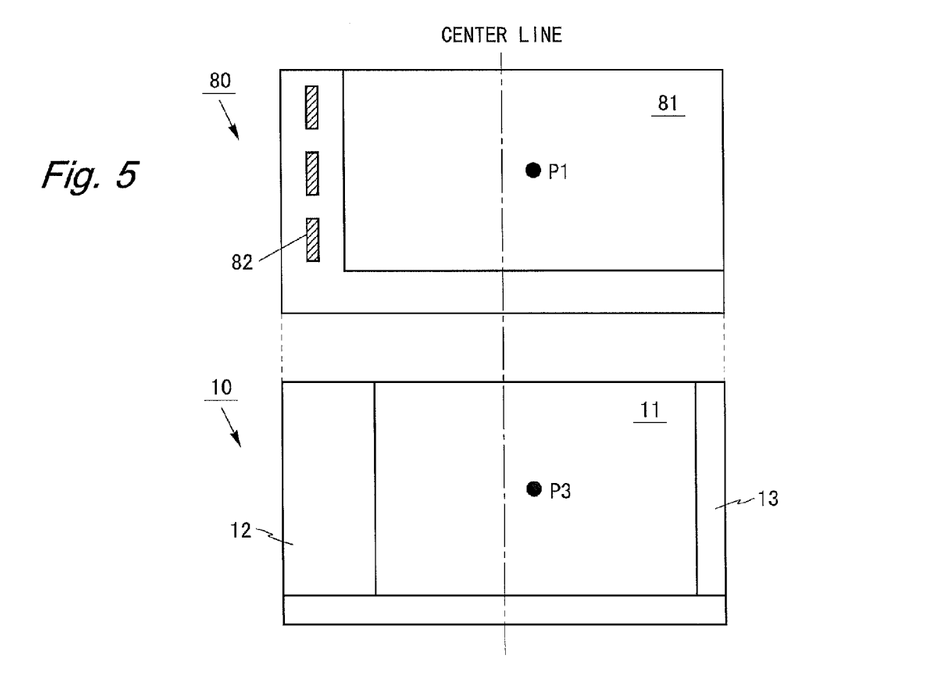
FIG. 5 is a diagram for describing effects brought about by the display panel according to the first embodiment.

With reference to FIG. 5, effects brought about by the display panel 10 according to the present embodiment will be described below. As described with reference to FIG. 12, in the conventional integral-type display panel 90, since the scanning signal line drive circuits 92 and 93 of the same size are symmetrically provided on both sides of the display region 91, the center P2 of the display region 91 is on the center line of the panel. Hence, the center position of the display region differs between the non-integral-type display panel 80 and the conventional integral-type display panel 90. Therefore, there is a problem that the conventional integral-type display panel 90 is not compatible with the non-integral-type display panel 80.

On the other hand, in the display panel 10 according to the present embodiment, as shown in FIG. 5, the first scanning signal line drive circuit 12 and the second scanning signal line drive circuit 13 are provided asymmetrically on both sides of the display region 11. Hence, the first scanning signal line drive circuit 12 and the second scanning signal line drive circuit 13 can be designed such that the center position of the display region of the display panel 10 matches that of the non-integral-type display panel 80. At this time, a center P3 of the display region 11 is at a location off the center line of the panel. Therefore, according to the display panel 10 according to the present embodiment, the center position of the display region of the display panel 10 is made to match that of the non-integral-type display panel 80, enabling to ensure compatibility with the non-integral-type display panel 80.

In addition, when two scanning signal line drive circuits are designed to have different sizes in the lateral direction, by suitably determining the widths of or spacings between wiring lines included in the signal control units 21, leakage between the wiring lines and breaks in the wiring lines are reduced, enabling to improve yield of display panels.

Second Embodiment

Figure 6:
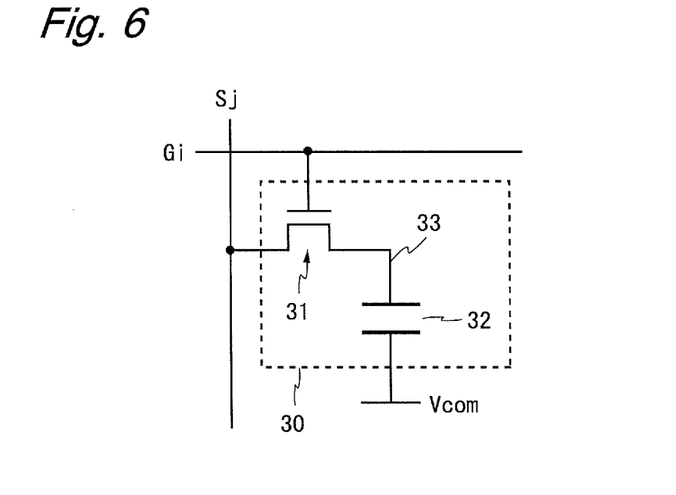
FIG. 6 is a circuit diagram of a pixel circuit included in a liquid crystal panel.

In a second embodiment, a method of preventing flicker in a liquid crystal panel having scanning signal line drive circuits provided asymmetrically on both sides of a display region will be described. First, with reference to FIGS. 6, 7A, and 7B, the principle of the occurrence of flicker will be described. FIG. 6 is a circuit diagram of a pixel circuit included in a liquid crystal panel. A pixel circuit 30 shown in FIG. 6 includes a write control transistor 31 and a liquid crystal capacitor 32. A gate terminal of the write control transistor 31 is connected to a scanning signal line Gi, a source terminal is connected to a video signal line Sj, and a drain terminal is connected to one electrode of the liquid crystal capacitor 32 (hereinafter, referred to as a pixel electrode 33). A common potential Vcom is applied to the other electrode of the liquid crystal capacitor 32.

Figure 7A:
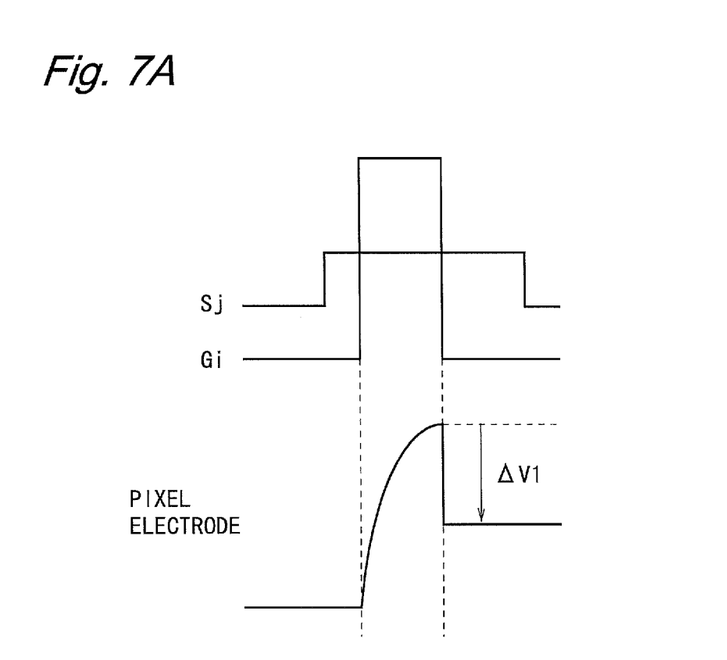
FIG. 7A is a signal waveform diagram showing changes in potential in the pixel circuit shown in FIG. 6.
Figure 7B:
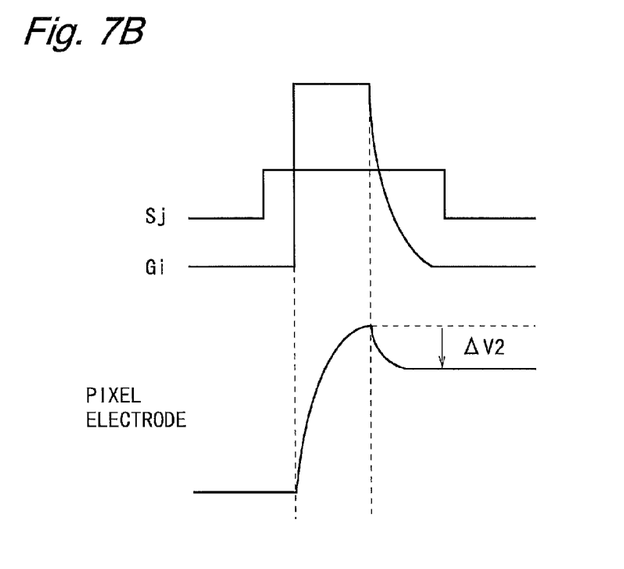
FIG. 7B is a signal waveform diagram showing changes in potential in the pixel circuit shown in FIG. 6.

FIGS. 7A and 7B are signal waveform diagrams showing changes in potential in the pixel circuit 30. FIGS. 7A and 7B describe changes in the potentials of the scanning signal line Gi, the video signal line Sj, and the pixel electrode 33. As shown in FIG. 7A, when the potential of the scanning signal line Gi changes from a high level to a low level, the potential of the pixel electrode 33 decreases by $\Delta V1$ due to pull-in. The amount of decrease in potential $\Delta V1$ at this time is given by the following equation (1):

$$\Delta V1 = VG_{p\text{-}p} \times Cgs/Ct \qquad (1).$$

Note that in equation (1) $VG_{p\text{-}p}$ is the amount of change in the potential of the scanning signal line Gi, Cgs is the gate-drain capacitance of the write control transistor 31, and Ct is the total capacitance associated with the drain terminal of the write control transistor 31. Ct includes an accumulation capacitor provided in parallel with the liquid crystal capacitor 32, the source-drain capacitance of the write control transistor 31, or the like, in addition to the liquid crystal capacitor 32 and Cgs.

When the scanning signal line Gi is long, rounding of a signal on the scanning signal line Gi occurs. When, as shown in FIG. 7B, the potential of the scanning signal line Gi slowly changes to a low level, the potential of the video signal line Sj is rewritten to the pixel electrode 33 during a period before the write control transistor 31 is placed in an off state. Hence, the potential of the pixel electrode 33 at the completion of write differs between the case shown in FIG. 7A and the case shown in FIG. 7B and the optimum common potential Vcom also differs therebetween. However, since the same common potential Vcom is supplied to all of the pixel circuits 30, flicker occurs in those pixel circuits 30 for which the supplied common potential Vcom is not optimum.

Figure 8:
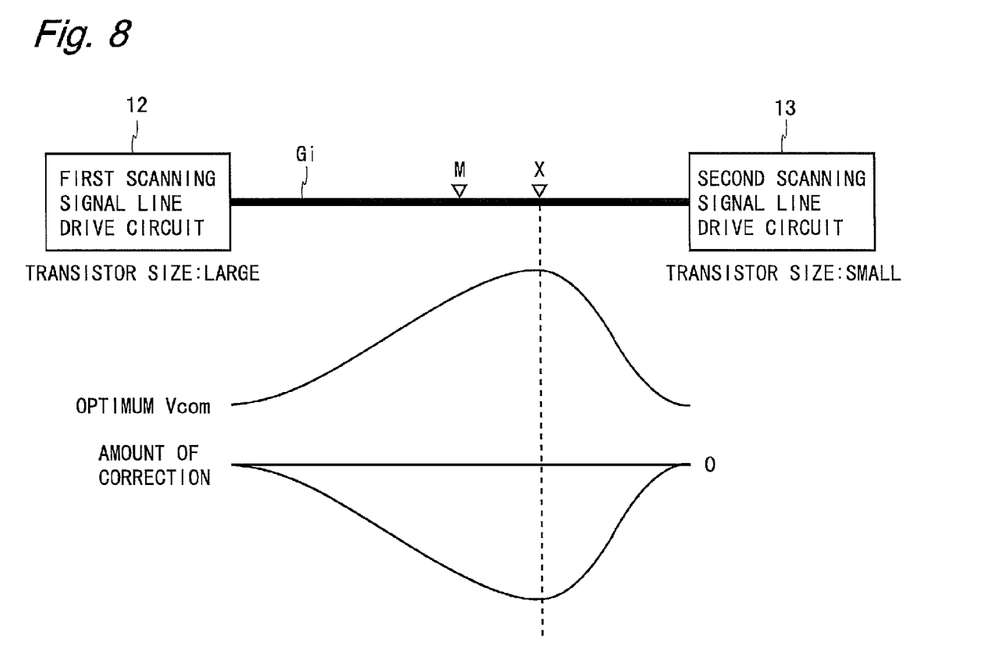
FIG. 8 is a diagram for describing a correction made in a display panel according to a second embodiment of the present invention.

Now, the case is considered in which in order to make the size in the lateral direction of the first scanning signal line drive circuit 12 larger than the size in the lateral direction of the second scanning signal line drive circuit 13 in the display panel 10 according to the first embodiment, the size of transistors (e.g., pull-up transistors 23, or the like) included in the first scanning signal line drive circuit 12 is made larger than the size of transistors included in the second scanning signal line drive circuit 13. In this case, the drive capability of the first scanning signal line drive circuit 12 is higher than that of the second scanning signal line drive circuit 13. Hence, as shown in FIG. 8, at a position X on a scanning signal line Gi closer to the second scanning signal line drive circuit 13 than a mid-point M, rounding of a signal on the scanning signal line Gi is maximum and the optimum value of the common potential Vcom is maximum.

A display panel according to the second embodiment has the same configuration as the display panel 10 according to the first embodiment. Note, however, that in the display panel according to the second embodiment each pixel circuit includes a correction capacitor whose size varies according to the position thereof in the extending direction of a scanning signal line Gi, and the size of the correction capacitor is maximum at a pixel circuit close to the second scanning signal line drive circuit 13. Here, the case in which the gate-drain capacitance of a write control transistor is used as a correction capacitor will be described.

Figure 9:
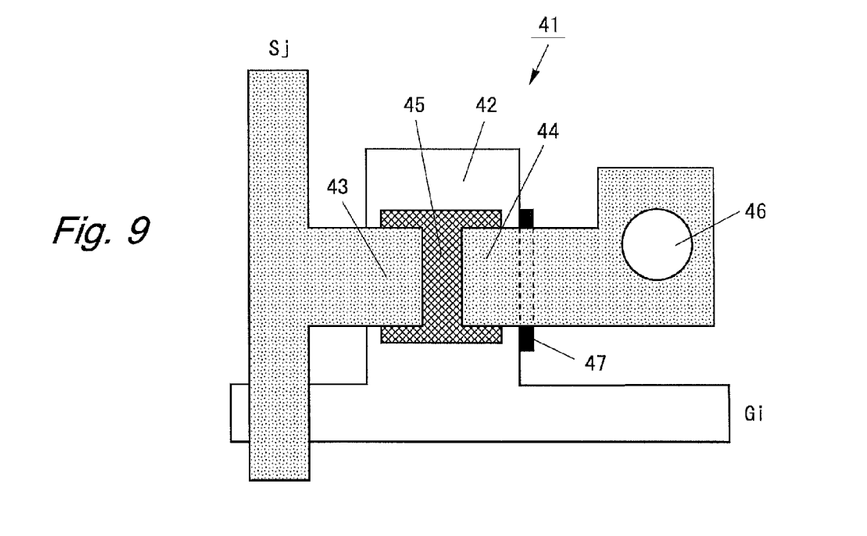
FIG. 9 is a layout diagram showing apart of a pixel circuit included in the display panel according to the second embodiment.

FIG. 9 is a layout diagram showing a part of a pixel circuit included in the display panel according to the present embodiment. By arranging a gate region 42, a source region 43, a drain region 44, and a semiconductor region 45 in the manner shown in FIG. 9, a write control transistor 41 is formed. The gate region 42 is integrally formed with a scanning signal line Gi, and the source region 43 is integrally formed with a video signal line Sj. The drain region 44 is connected to a pixel electrode (not shown) through a contact hole 46. In addition, a correction region 47 is integrally formed with the gate region 42 at a location where the correction region 47 overlaps the drain region 44. The size of a portion where the correction region 47 overlaps the drain region 44 varies according to the position thereof in the extending direction of the scanning signal line Gi, and is maximum at a pixel circuit close to the second scanning signal line drive circuit 13 (at a pixel circuit at the position X in FIG. 8).

Effects brought about by the display panel according to the present embodiment will be described below. As the size of a portion where the correction region 47 overlaps the drain region 44 increases, the gate-drain capacitance of the write control transistor 41 increases, and thus, the amount of decrease in the potential of the pixel electrode $\Delta V1$ when the potential of the scanning signal line Gi changes also increases. Due to this, the larger the size of the correction region 47, the lower the optimum common potential Vcom. In addition, as described above, the size of the correction region 47 varies according to the position thereof in the extending direction of the scanning signal line Gi, and is maximum at a pixel circuit close to the second scanning signal line drive circuit 13.

Therefore, even when the optimum common potential Vcom changes due to rounding of a signal on the scanning signal line Gi, by suitably changing the size of the correction region 47 to compensate for the amount of change in common potential Vcom, the optimum common potential Vcom can be kept constant or the amount of change in optimum common potential Vcom can be reduced (see FIG. 8). Thus, even when two scanning signal line drive circuits are provided asymmetrically on both sides of the display region, a suitable correction is made according to the position in the extending direction of the scanning signal line Gi and thus desired voltages can be written to the pixel circuits. By this, flicker is prevented, enabling to prevent a reduction in display quality.

Note that in the above description the case is described in which the gate-drain capacitance of the write control transistor 41 is used as a correction capacitor. Instead of this, the size of any other component included in the pixel circuit may be changed according to the position thereof in the extending direction of the scanning signal line Gi such that the size of the component is maximum or minimum at a pixel circuit close to one of the scanning signal line drive circuits whose size in the lateral direction is smaller than that of the other. For example, the area of a portion where the pixel electrode overlaps the scanning signal line, the area of a portion where a branch wiring line from the scanning signal line overlaps a branch wiring line from the drain region, or the like, may be changed. Even by a display panel according to this variant, the same effects can be obtained.

Third Embodiment

Figure 10:
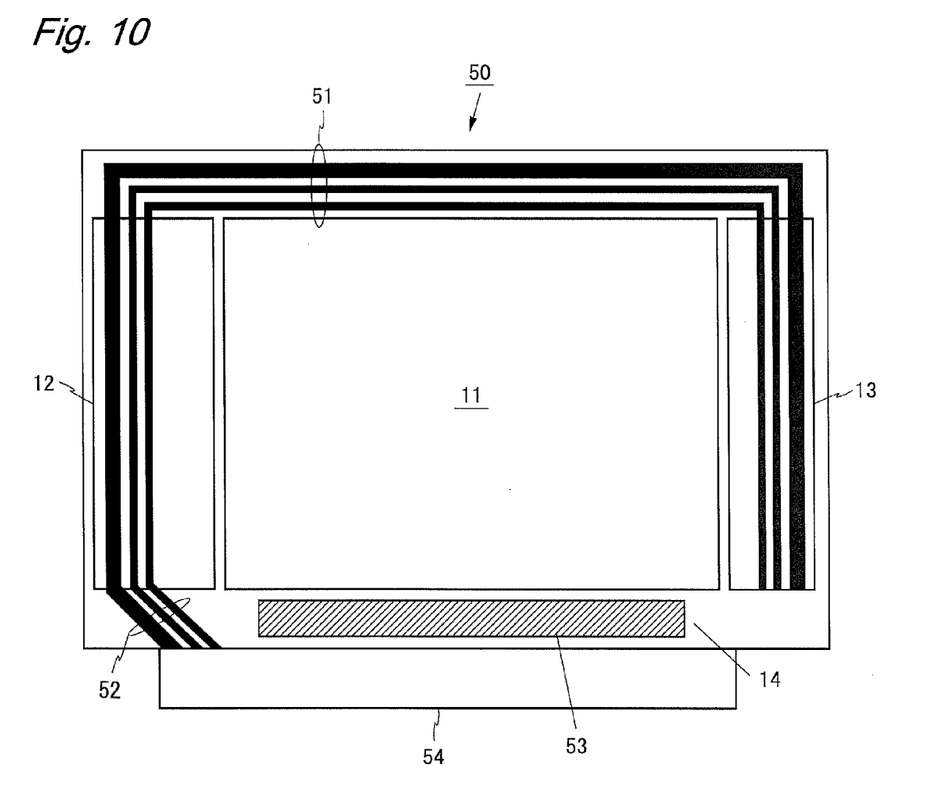
FIG. 10 is a plan view showing a schematic configuration of a display panel according to a third embodiment of the present invention.

FIG. 10 is a plan view showing a schematic configuration of a display panel according to a third embodiment of the present invention. As with a display panel 10 according to the first embodiment, a display panel 50 shown in FIG. 10 is a liquid crystal panel including a display region 11, a first scanning signal line drive circuit 12, a second scanning signal line drive circuit 13, and a chip-mounted region 14 for a video signal line drive circuit. Of the components of the present embodiment, the same components as those of the first embodiment are denoted by the same reference characters and description thereof is omitted.

FIG. 10 describes main wiring lines arranged on the display panel 50, a semiconductor chip 53 including a video signal line drive circuit, and a flexible printed board 54 connected to the display panel 50. A DC/DC conversion circuit and a display control circuit (not shown) are provided outside the display panel 50. Output signals from these circuits are supplied to the first scanning signal line drive circuit 12 and the second scanning signal line drive circuit 13 through the flexible printed board 54.

The first scanning signal line drive circuit 12 and the second scanning signal line drive circuit 13 include main wiring lines. The display panel 50 includes connecting wiring lines 51 to connect the main wiring lines included in the first scanning signal line drive circuit 12 to the main wiring lines included in the second scanning signal line drive circuit 13. The first scanning signal line drive circuit 12 is formed along one of the four sides of the display region 11, the second scanning signal line drive circuit 13 is formed along another side, and the chip-mounted region 14 is provided along still another side. The connecting wiring lines 51 are arranged along the remaining side of the display region 11 (the upper side in FIG. 10). In addition, the connecting wiring lines 51 are arranged so as not to intersect with video signal lines S1 to Sn arranged in the display region 11. One ends of the respective connecting wiring lines 51 are connected to the main wiring lines included in the first scanning signal line drive circuit 12, and the other ends of the respective connecting wiring lines 51 are connected to the main wiring lines included in the second scanning signal line drive circuit 13.

The display panel 50 is provided with wiring lines 52 that connect wiring lines (not shown) on the flexible printed board 54 to the main wiring lines included in the first scanning signal line drive circuit 12. On the other hand, wiring lines that connect the wiring lines on the flexible printed board 54 to the main wiring lines included in the second scanning signal line drive circuit 13 are not provided. A power supply potential and control signals are supplied to the first scanning signal line drive circuit 12 from the outside of the display panel 50 through the wiring lines 52. The power supply potential and the control signals are supplied to the second scanning signal line drive circuit 13 from the outside of the display panel 50 through the wiring lines 52, the main wiring lines included in the first scanning signal line drive circuit 12, and the connecting wiring lines 51.

As shown above, the display panel 50 according to the present embodiment includes the connecting wiring lines 51 that connect the main wiring lines included in the first scanning signal line drive circuit 12 to the main wiring lines included in the second scanning signal line drive circuit 13. Therefore, the number of wiring lines connecting the scanning signal line drive circuits to the outside of the display panel 50 is reduced, thereby narrowing the width of the flexible printed board 54 connected to the display panel 50, and thus, the cost of the flexible printed board 54 can be reduced.

In addition, the connecting wiring lines 51 are arranged along one of the four sides of the display region 11 other than the sides where the first scanning signal line drive circuit 12, the second scanning signal line drive circuit 13, and the chip-mounted region 14 are provided. Therefore, the connecting wiring lines 51 are arranged so as not to intersect with the video signal lines S1 to Sn arranged in the display region 11, thereby reducing the load associated with the video signal lines S1 to Sn, and thus, a reduction in display quality can be prevented.

Note that although the first to third embodiments describe liquid crystal panels as examples of a display panel to which the present invention is applied, the present invention can also be applied to display panels other than liquid crystal panels.

INDUSTRIAL APPLICABILITY

Display panels of the present invention have a feature that the display panels are compatible with non-integral-type display panels, and thus, can be used as various types of display panels such as liquid crystal panels.

DESCRIPTION OF REFERENCE CHARACTERS 10 and 50: DISPLAY PANEL
11: DISPLAY REGION
12: FIRST SCANNING SIGNAL LINE DRIVE CIRCUIT
13: SECOND SCANNING SIGNAL LINE DRIVE CIRCUIT
14: CHIP-MOUNTED REGION
15: PIXEL CIRCUIT
16: MAIN WIRING LINE
17: SHIFT REGISTER
20: UNIT CIRCUIT
21: SIGNAL CONTROL UNIT
22: OUTPUT UNIT
23: PULL-UP TRANSISTOR
24: PULL-DOWN TRANSISTOR
25: BOOTSTRAP CAPACITOR
41: WRITE CONTROL TRANSISTOR
47: CORRECTION REGION
51: CONNECTING WIRING LINE

The invention claimed is:

1. A display panel in which scanning signal line drive circuits are integrally formed, the display panel comprising:
    a display region including a plurality of pixel circuits arranged two-dimensionally and a plurality of scanning signal lines extending in a predetermined direction;
    a first scanning signal line drive circuit formed along one side of the display region by a same process as the pixel circuits, and driving the scanning signal lines; and
    a second scanning signal line drive circuit formed along an opposite side of the display region by the same process as the pixel circuits, and driving the scanning signal lines with the first scanning signal line drive circuit, wherein
    the first and second scanning signal line drive circuits have different sizes in a lateral direction;
    each pixel circuit includes a component whose size varies according to a position thereof in an extending direction of the scanning signal lines; and
    the size of the component is maximum or minimum at a pixel circuit close to one of the first and second scanning signal line drive circuits whose size in the lateral direction is smaller than that of the other.

2. The display panel according to claim 1, wherein the first and second scanning signal line drive circuits each include a shift register having unit circuits connected in multi-stage and a plurality of main wiring lines that supply a power supply potential and a control signal to the shift register,
    each unit circuit including a signal control unit that determines a potential to be applied to a corresponding scanning signal line and an output unit that applies the potential determined by the signal control unit to the scanning signal line.

3. The display panel according to claim 2, wherein
    the output unit includes a pull-up transistor that applies a high-level potential to the scanning signal line and a pull-down transistor that applies a low-level potential to the scanning signal line, and
    a size of at least one of the pull-up transistor and the pull-down transistor differs between the first and second scanning signal line drive circuits.

4. The display panel according to claim 2, wherein
    the output unit includes a bootstrap capacitor provided at a control terminal of a transistor that applies a potential to the scanning signal line, and
    a capacitance of the bootstrap capacitor differs between the first and second scanning signal line drive circuits.

5. The display panel according to claim 2, wherein a size of a transistor included in the signal control unit differs between the first and second scanning signal line drive circuits.

6. The display panel according to claim 2, wherein widths of the main wiring lines differ between the first and second scanning signal line drive circuits.

7. The display panel according to claim 6, wherein a width of a main wiring line for power supply included in the main wiring lines differs between the first and second scanning signal line drive circuits.

8. The display panel according to claim 6, wherein a width of a main wiring line for a clock included in the main wiring lines differs between the first and second scanning signal line drive circuits.

9. The display panel according to claim 2, wherein a width of a wiring line included in the signal control unit differs between the first and second scanning signal line drive circuits.

10. The display panel according to claim 2, wherein a spacing between wiring lines included in the signal control unit differs between the first and second scanning signal line drive circuits.

11. The display panel according to claim 1, wherein each pixel circuit includes a write control transistor and a correction capacitor provided between a control terminal and one conduction terminal of the write control transistor, and
    a size of the correction capacitor varies according to a position thereof in the extending direction of the scanning signal lines, and is maximum at a pixel circuit close to one of the first and second scanning signal line drive circuits whose size in the lateral direction is smaller than that of the other.

12. The display panel according to claim 1, further comprising a connecting wiring line that connects a main wiring line included in the first scanning signal line drive circuit to a main wiring line included in the second scanning signal line drive circuit.

13. The display panel according to claim 12, comprising a chip-mounted region for a video signal line drive circuit provided along one of four sides of the display region other than sides where the first and second scanning signal line drive circuits are formed, wherein
    the connecting wiring line is arranged along a remaining side of the display region.

* * * * *